United States Patent
Nicoletti

(10) Patent No.: US 8,604,590 B2
(45) Date of Patent: Dec. 10, 2013

(54) TRANSISTOR WITH ENHANCED CAPACITANCE AT ELECTRODES AND TRANSISTOR WITH LIGHT EMITTING CAPACITIVE ELEMENT

(75) Inventor: Leonard D. Nicoletti, Philadelphia, PA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1222 days.

(21) Appl. No.: 12/453,150

(22) Filed: Apr. 30, 2009

(65) Prior Publication Data

US 2010/0277466 A1     Nov. 4, 2010

(51) Int. Cl.
*H01L 29/66*     (2006.01)
(52) U.S. Cl.
USPC ......... 257/565; 257/47; 257/577; 257/E29.03
(58) Field of Classification Search
CPC ............ H01L 27/0647; H01L 27/0652; H01L 27/0658; H01L 27/067; H01L 27/075; H01L 27/0755; H01L 27/0783; H01L 29/73
USPC .............. 257/526, 552–566, 577, 47, E29.03, 257/E29.171
See application file for complete search history.

(56) References Cited

U.S. PATENT DOCUMENTS

| | | | | |
|---|---|---|---|---|
| 3,573,571 A | * | 4/1971 | Brown et al. | 257/488 |
| 3,979,734 A | * | 9/1976 | Pricer et al. | 365/149 |
| 4,245,231 A | | 1/1981 | Davies | |
| 5,409,846 A | | 4/1995 | Hirose | |
| 7,064,346 B2 | | 6/2006 | Kawasaki et al. | |
| 7,122,421 B2 | | 10/2006 | Sanchez et al. | |
| 2010/0019350 A1 | * | 1/2010 | Park | 257/565 |

* cited by examiner

*Primary Examiner* — Kenneth Parker
*Assistant Examiner* — Jose R Diaz

(57) ABSTRACT

A bipolar transistor structure with multiple electrodes configured to include an enhanced base capacitive element. Alternatively, a transistor with an integrated light emitting capacitive (LEC) element at the source or drain of the transistor. The transistor may be a stand alone transistor for usage in discrete applications, or may be implemented in a pixel circuit used in a display apparatus. In the pixel circuit embodiment, driver circuitry causes appropriate charging and discharging of the LEC elements of respective pixels to provide a desired display. In one alternative, a transistor may be configured to have multiple LEC elements integrated therewith, to provide respective different colors used in forming a display.

8 Claims, 5 Drawing Sheets

US 8,604,590 B2

TRANSISTOR WITH ENHANCED CAPACITANCE AT ELECTRODES AND TRANSISTOR WITH LIGHT EMITTING CAPACITIVE ELEMENT

BACKGROUND OF THE INVENTION

1. Field of the Invention

This invention relates generally to transistor structures and more particularly to a bipolar transistor with enhanced capacitance at multiple electrodes, and more particularly to a transistor with a light emitting capacitive element.

2. Description of the Related Art

Although there have been many advances in semiconductor devices and in particular transistor devices, a number of issues remain regarding such devices, particular with regard to particular applications. For example, noise, high current requirements, power consumption, biasing limitations, and signal delays remain significant issues with regard to existing transistor design.

Typically, a capacitor might be connected to one of the electrodes of a transistor to provide a desired response. However, this solution is typically limited to one electrode, and usually is merely an external capacitor attached to an electrode, such as an emitter electrode of a transistor used in an operational amplifier.

SUMMARY OF THE INVENTION

In one embodiment, a bipolar transistor structure comprises a base that is configured to include an enhanced base capacitive element. The enhanced base capacitive element includes a first conductive portion to which an electrical connection to the base of the bipolar transistor is effectively made, and further includes a second conductive portion having a direct electrical connection to the base junction of the bipolar transistor.

The bipolar transistor structure also includes a collector and an emitter, with the emitter configured to include an enhanced emitter capacitive element. The enhanced emitter capacitive element includes a third conductive portion to which an electrical connection to the emitter of the bipolar transistor is effectively made, and further includes a fourth conductive portion having a direct electrical connection to the emitter junction of the bipolar transistor.

In one alternative, an enhanced emitter capacitive element may be included at each of the base, collector and emitter of the bipolar transistor.

According to another embodiment, a transistor has an integrated light emitting capacitive (LEC) element at the source or drain of the transistor. The transistor may be a stand alone transistor for usage in discrete applications, or may be implemented in a pixel circuit used in a display apparatus. In the pixel circuit embodiment, driver circuitry causes appropriate charging and discharging of the LEC elements of respective pixels to provide a desired display.

In one alternative, a transistor may be configured to have multiple LEC elements integrated therewith, to provide respective different colors used in forming a display.

The present invention can be embodied in various forms, including business processes, computer implemented methods, computer program products, computer systems and networks, user interfaces, application programming interfaces, and the like.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

Figure 1:
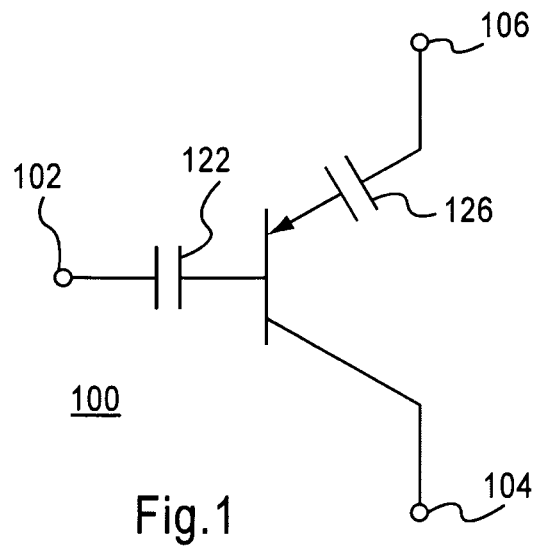
FIG. 1 is a diagram illustrating an example of a bipolar transistor with enhanced capacitance at multiple electrodes.

FIG. 1 is a schematic diagram illustrating an example of a bipolar transistor 100 with enhanced capacitance at multiple electrodes. The bipolar transistor 100 includes base 102, collector 104 and emitter 106 electrodes to which electrical connection to the base, collector and emitter of the bipolar transistor is effectively made.

The bipolar transistor 100 may be a stand alone transistor for usage in discrete applications or may be one or many such transistors, particularly when implemented in an integrated circuit.

The bipolar transistor 100 also includes capacitive elements 122, 126 corresponding to multiple electrodes, particularly the base electrode 102 and emitter electrode 106 in this example.

The capacitive elements 122, 126 are not wholly separate capacitors that are simply connected to the bipolar transistor 100. Rather, the capacitive elements 122, 126 are integrated with the relevant bipolar transistor junctions.

For example, in a plate-type capacitor, one of the plates is directly electrically connected to the effective electrode and the other plate is directly connected to the relevant junction of the transistor. For example, one of the two plates of the capacitive element may be fused (wave soldered, welded, evaporated, plated, sputtered as the same conductor) directly to the transistor junction (either P or N junction). Alternatively, insulated wires can be run through the capacitor plate to the inside plate of the capacitor on one end and to the transistor junction on the other end.

With this configuration, optimum performance can be realized with a perfectly mated capacitor-transistor junction interface. There is less noise without a wire connecting the capacitor to the transistor in conventional fashion. In precision application a wire or conductor lead acts like an antenna. The capacitance may be set to have very high input impedance, lowering the base to emitter drain current, lowering noise, increasing sensitivity, selectivity and Q factor. Biasing the transistor may be made in accordance with the characteristic impedance at each junction of the transistor. The transistor may also have DC switching and memory applications.

Figure 2:
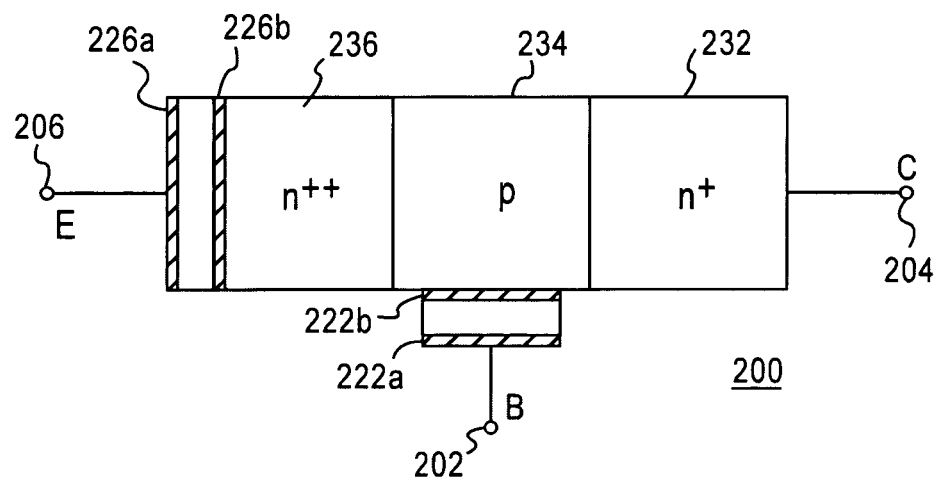
FIG. 2 is a diagram illustrating a bipolar transistor with enhanced capacitance at multiple electrodes consistent with the example of FIG. 1.

FIG. 2 is a diagram illustrating a bipolar transistor 200 with enhanced capacitance at multiple electrodes consistent with the schematic diagram of the transistor illustrated in FIG. 1. The illustrated bipolar transistor 200 is of the NPN type but examples consistent with the present invention may also be of the PNP type. The bipolar transistor includes a base region 234, emitter region 236 and collector region 232, and respectively corresponding to those regions a base electrode 202, emitter electrode 206 and collector electrode 204.

The capacitive element of the emitter includes first conductive portion (e.g., plate) 226a and second conductive portion (e.g., plate) 226b, with suitable dielectric material or the like between the two conductive portions. The first conductive portion 226a is directly electrically connected to the emitter electrode 206, and the second conductive portion 226b is fused to the emitter region 236 of the bipolar transistor 200, using techniques such as those described above.

A variety of suitable dielectric materials may be provided depending upon operational signal frequencies, device characteristics and intended implementation constraints. Suitable dielectric materials include but are not limited to crystal, vacuum, air, gas, ionized material, a single charged particle, charged particles, or suitable combinations of any of such dielectric materials. Stabilization agents may be incorporated into the dielectric materials as well. Finally, depending upon the capacitance, transistor junction material, and signal frequencies the transistor junctions may be the most suitable dielectric material with out adding additional material. Additionally, the transistor capacitor(s) may have both fixed and variable capacitance as desired, depending upon factors including the dielectric material and the signal processing application.

Similarly, the capacitive element of the base includes first conductive portion (e.g., plate) 222a and second conductive portion (e.g., plate) 222b, also with suitable dielectric material or the like between them. The first conductive portion 222a is directly connected to the base electrode 202, and the second conductive portion 222b is fused to the base region 234 of the bipolar transistor 200.

Figure 3:
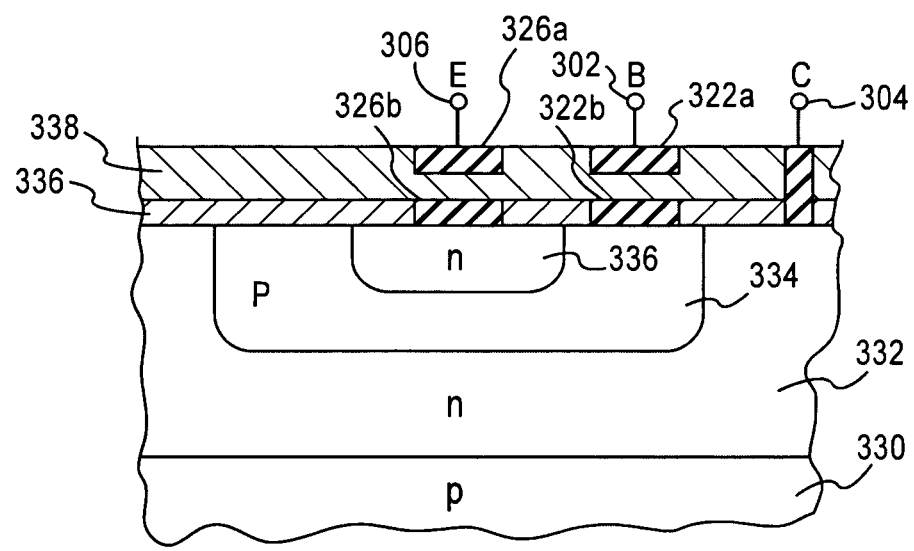
FIG. 3 is a cross sectional diagram illustrating a bipolar transistor with enhanced capacitance at multiple electrodes consistent with the example of FIG. 1.

FIG. 3 is a cross sectional diagram illustrating a bipolar transistor 300 with enhanced capacitance at multiple electrodes consistent with the example of FIG. 1. The bipolar transistor 300 is preferably formed as part of an integrated circuit using conventional semiconductor processing techniques. Again, the bipolar transistor 300 is an NPN type transistor, but the transistor may be of alternative types such as PNP.

The bipolar transistor 300 is formed on a p-type substrate 330. The collector region 332 is composed of n-type material, the base region 334 is composed of p-type material, and the emitter region 336 is composed of n-type material. Conventional techniques including diffusion and implantation and appropriate dopant materials may be used to form these regions.

The capacitive element of the emitter includes first conductive portion 326a and second conductive portion 326b, and the capacitive element of the base includes the first conductive portion 322a and the second conductive portion 322b.

The first conductive portion 326a is directly electrically connected to and may actually be the metal layer that provides the emitter electrode 306. Similarly, the first conductive portion 322a is directly electrically connected to and may actually be the metal layer that provides the base electrode 302. The collector electrode 304 is connected to the collector region 332.

Insulative material 336, 338, such as silicon oxide, separates the electrodes and provides electrical separation between the respective plates of the capacitive elements. An initial formation of a first insulative layer 336 followed by formation of patterns and selective removal of the first insulative layer 336 and metallization may be used to form the second conductive portions 322b, 326b respectively in contact with the base region 334 and emitter region 336.

Another insulative layer 338, selectively removed, with subsequent metallization forms the first conductive portions 322a, 326a suitably insulated from the first conductive patterns 322b, 326b.

Figure 4:
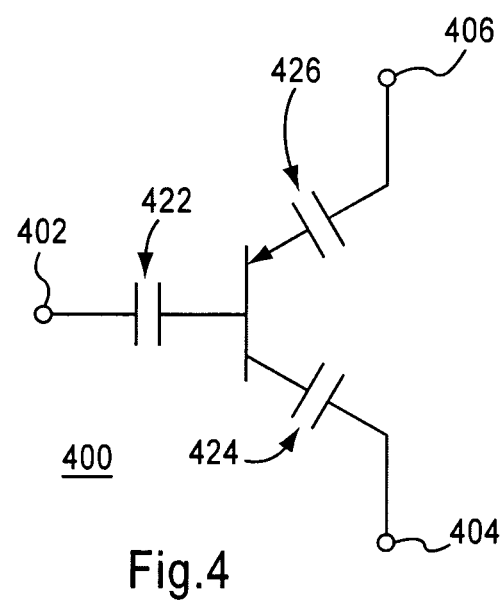
FIG. 4 is a diagram illustrating an example of a bipolar transistor with enhanced capacitance at the base, emitter and collector electrodes.

FIG. 4 is a schematic diagram illustrating an example of a bipolar transistor 400 with enhanced capacitance at the base 402, emitter 406 and collector 404 electrodes. Similar to the FIG. 1 example, the bipolar transistor 400 may be a stand alone transistor for usage in discrete applications or may be one or many such transistors, particularly when implemented in an integrated circuit.

The bipolar transistor 400 also includes capacitive elements 422, 424, 426 corresponding to the base electrode 402, the collector electrode 404, and the emitter electrode 406 in this example.

The capacitive elements 422, 424, 426 again are not separate capacitors that are in turn connected to the bipolar transistor 400, but are instead capacitive elements 422, 424, 426 that are integrated with the relevant bipolar transistor junctions of the bipolar transistor 400.

In the example of a plate-type capacitor, one of the plates is directly electrically connected to the effective electrode and the other plate is directly connected to the relevant junction of the transistor.

Figure 5:
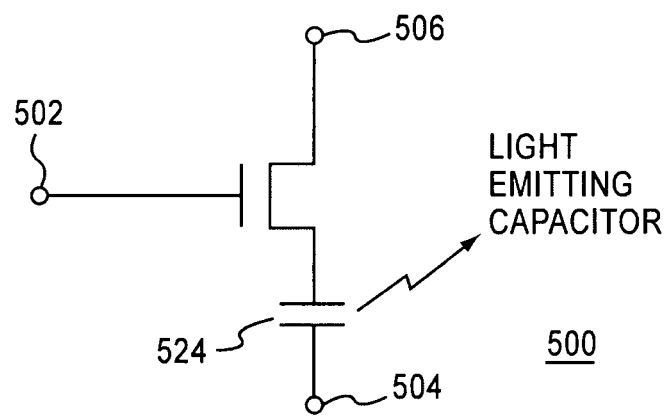
FIG. 5 is a diagram illustrating another example of a transistor with enhanced capacitance and light emitting characteristics.

FIG. 5 is a diagram illustrating another example of a transistor 500 with enhanced capacitance and light emitting characteristics. As opposed to the transistor 100 of FIG. 1, this transistor is preferably a MOS type transistor. The transistor 500 includes gate 502, drain 504 and source 506 electrodes to which electrical connection to the gate, drain and source the transistor is effectively made.

The transistor 500 may be a stand alone transistor for usage in discrete applications, but preferably is one of many such transistors implemented in an integrated circuit, particularly a pixel circuit used in a display apparatus as described further below. Additionally, in some display apparatus embodiments, the capacitance component of the transistor may be used in support of touch screen functionality.

The transistor 500 also includes a light emitting capacitive element (LEC) 524 corresponding to the drain. As with the embodiment of FIG. 1, the capacitive element 524 may preferably be integrated with the transistor 500, particularly the source of the transistor 500 in this example, so that connection to the source electrode 504 accommodates connection to the LEC 524. The LEC 524 is preferably fabricated to be integrated with the transistor 500 using conventional semiconductor processes. As an alternative, the LEC 524 may also be fabricated separately from, but connected to the relevant transistor element in order to perform the same function.

The LEC 524 is similar to a conventional capacitor. However, the dielectric is a chemical or the like that gives off photons when the capacitor is charged. This may be useful for lighting applications in a single transistor application. Alternatively, the light may be used as the source of light in respective pixels in a pixel circuit that is part of a display apparatus.

Figure 6:
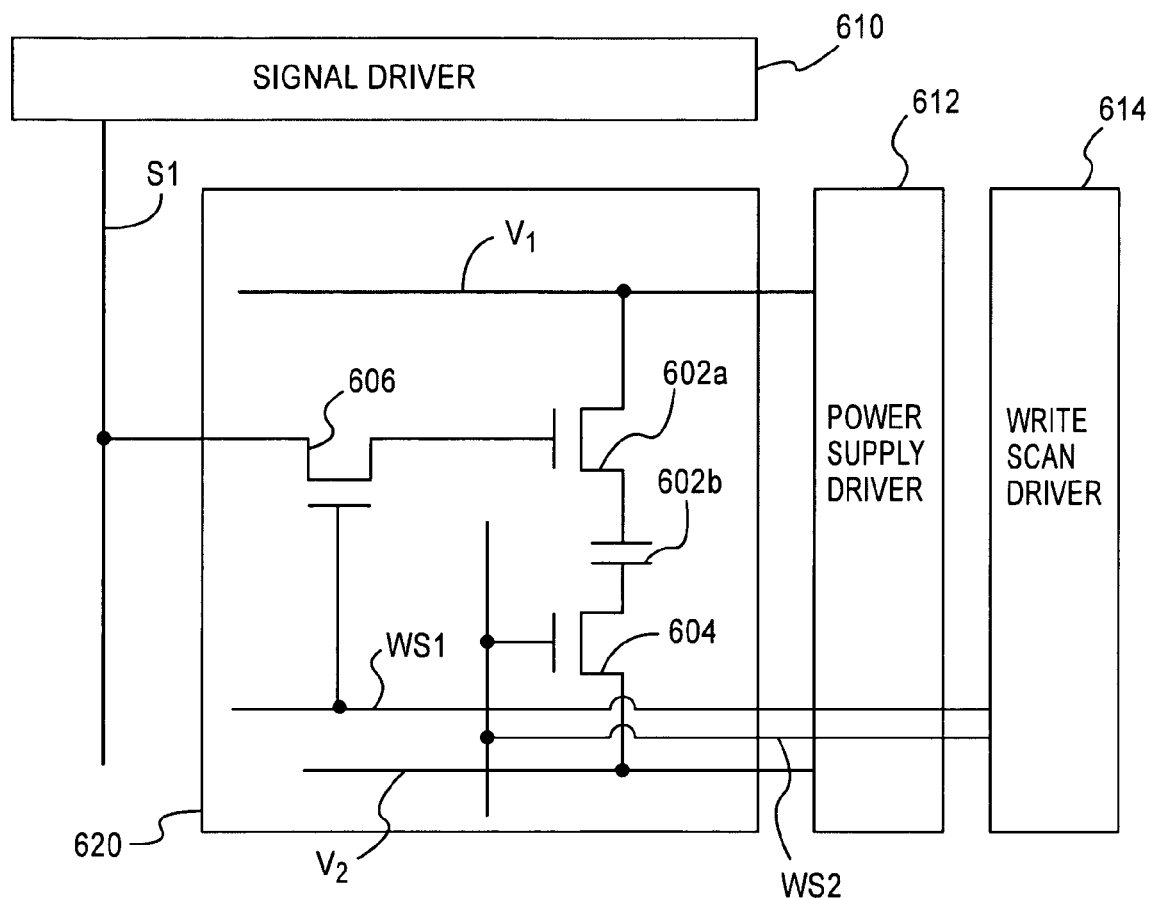
FIG. 6 is a circuit diagram illustrating an example of a pixel circuit of a display apparatus, with the pixel circuit implementing a transistor with enhanced capacitance and light emitting characteristics.

FIG. 6 is a circuit diagram illustrating an example of a pixel circuit 620 of a display apparatus, with the pixel circuit 620 implementing a transistor with enhanced capacitance and light emitting characteristics (the transistor function is designated as 602a, and the corresponding LEC 602b in the figure; by way of example the transistor may be as described in connection with FIG. 5 above). The transistor 602a is configured as a drive transistor in the pixel circuit 620. In conjunction with a switching transistor 604 and select transistor 606, appropriate charging and discharging of the LEC 602b is accommodated to effect the desired display characteristics for the relevant pixel.

Although one pixel is shown in the pixel circuit 620, this is solely for ease of illustration, and it is well recognized that many thousands of pixels may actually be included for the desired display characteristics.

A variety of driver circuits, namely a signal driver 610, power supply driver 612 and write scan driver 614 are configured to provide signals appropriate for the desired charging and discharging of desired LECs and therefore pixels in the pixel circuit 620. The various lines output by these drivers 610-614 connect to the various pixels forming a matrix in the pixel circuit. Signals and corresponding timing dictate the charging and discharging of pixels to provide the desired display. Specifically, the signal driver 610 provides the image input signal, denoted as S1 for the line corresponding to the depicted pixel. The signal line is connected to the source of the select transistors (e.g., select transistor 606). The power supply driver 612 drives one potential V1 that is connected to the source of the drive transistors (e.g., drive transistor 602a) and another potential V2 that is connected to the drain of the switch transistors (e.g., switch transistor 604). The write scan driver 614 drives write signal lines such as WS1, connected to the gate of the select transistor 606. Another write signal line, WS2, is connected to the gate of the switching transistor 604.

Causing the write scan lines WS1, WS2 to be at levels appropriate for turning the select transistor 606 and switch transistor 605 on, and the potentials V1, V2 to be at appropriate levels causes a charging of the LEC 602b to the desired extent. Also, operation of the switch transistor 604 following a desired light emission period may be used to discharge the LEC 602b.

Since the LEC 602b can hold a charge and corresponding light emission, the pixel circuit 620 may be desirable for displays having a relatively static display, or a display that does not change frequently, such as an electronic billboard. Alternatively, with appropriate timing, conventional real time displays including video with motion images may be displayed, such as with broadcast or recorded high definition television signals.

Figure 7:
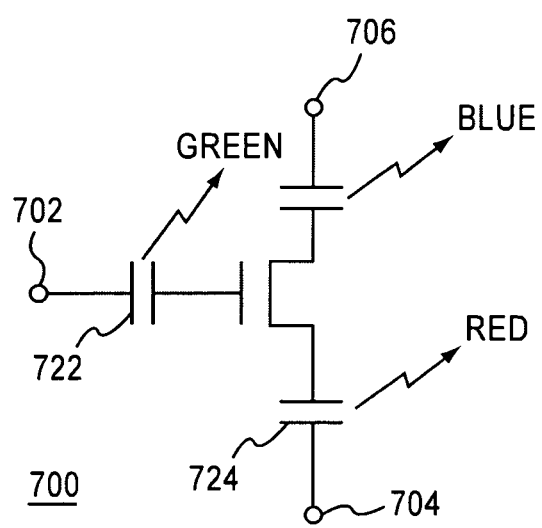
FIG. 7 is a diagram illustrating an example of a transistor with enhanced capacitance and light emitting characteristics with different colors respectively at the gate, source and drain.

Finally, FIG. 7 is a diagram illustrating an example of a transistor with enhanced capacitance and light emitting characteristics with different colors respectively at the gate 702, source 706 and drain 704. Specifically, a green LEC 722 is associated with the gate 702, a red LEC 724 is associated with the drain 704, and a blue LEC 726 is associated with the source 706. Appropriate application of driving signals and corresponding circuitry to manipulate the charge in the respective LECs 722-724 allows three color pixel display in a pixel circuit having substantially fewer transistors and less corresponding usage of integrated circuit resources.

Thus embodiments of the present invention produce and provide a bipolar transistor with enhanced capacitance at multiple electrodes, and a transistor with associated light emitting capacitance. Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. A bipolar transistor structure, comprising:
   a base, configured to include an enhanced base capacitive element, wherein the enhanced base capacitive element comprises a first conductive portion to which an electrical connection to a base electrode of the base is effectively made and a second conductive portion having a direct electrical connection to a base junction of the base;
   a collector; and
   an emitter, configured to include an enhanced emitter capacitive element, wherein the enhanced emitter capacitive element comprises a third conductive portion to which an electrical connection to an emitter electrode of the emitter is effectively made and a fourth conductive portion having a direct electrical connection to an emitter junction of the emitter,
   wherein the base capacitive element and the emitter capacitive element are plate-type capacitors and wherein the second conductive portion is a plate fused to the base junction and the fourth conductive portion is a plate fused to the emitter junction.

2. The bipolar transistor of claim 1, wherein the collector is configured to include an enhanced collector capacitive element, wherein the enhanced collector capacitive element comprises a fifth conductive portion to which an electrical connection to a collector electrode of the collector is effectively made and a sixth conductive portion having a direct electrical connection to a collector junction of the collector.

3. The bipolar transistor of claim 1, wherein the bipolar transistor is an NPN type transistor.

4. The bipolar transistor of claim 1, wherein the bipolar transistor is a PNP type transistor.

5. The bipolar transistor of claim 1, wherein the bipolar transistor is formed on a semiconductor substrate.

6. The bipolar transistor of claim 1, further comprising an insulating material that provides electrical separation between the first conductive portion and the second conductive portion, and between the third conductive portion and the fourth conductive portion.

7. The bipolar transistor of claim 6, wherein the insulating material separates the emitter electrode and the base electrode.

8. The bipolar transistor of claim 1, wherein the second conductive portion and the fourth conductive portion are at least wave soldered, welded, evaporated, plated, and/or sputtered to the base junction and to the emitter junction respectively.

* * * * *